United States Patent
Behel et al.

(10) Patent No.: US 6,812,771 B1
(45) Date of Patent: Nov. 2, 2004

(54) DIGITALLY-CONTROLLED, VARIABLE-GAIN MIXER AND AMPLIFIER STRUCTURES

(75) Inventors: John Kevin Behel, Greensboro, NC (US); Frank Murden, Greensboro, NC (US); Michael Elliott, Summerfield, NC (US); Joseph Michael Hensley, Kernersville, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/664,717

(22) Filed: Sep. 16, 2003

(51) Int. Cl.[7] .................................................. G06G 7/16
(52) U.S. Cl. ...................... 327/359; 327/356; 327/563; 330/254
(58) Field of Search ................................ 327/355, 356, 327/359, 562, 563, 103; 330/252–254, 257, 261, 269, 273, 278, 295; 455/326

(56) References Cited

U.S. PATENT DOCUMENTS

| | | | | |
|---|---|---|---|---|
| 5,077,541 A | | 12/1991 | Gilbert ........................ 339/284 |
| 5,589,791 A | | 12/1996 | Gilbert ........................ 327/359 |
| 5,668,501 A | * | 9/1997 | Venes .......................... 330/254 |
| 5,684,431 A | * | 11/1997 | Gilbert et al. ............... 330/254 |
| 5,815,039 A | * | 9/1998 | Kimura ....................... 330/252 |
| 5,859,559 A | | 1/1999 | Hong et al. ................. 327/359 |
| 5,900,781 A | * | 5/1999 | Igarashi et al. ............. 330/254 |
| 5,926,068 A | * | 7/1999 | Harr ............................ 330/254 |
| 5,933,771 A | | 8/1999 | Tiller et al. ................. 455/333 |
| 5,977,828 A | | 11/1999 | Hu et al. ..................... 330/254 |
| 6,118,339 A | * | 9/2000 | Gentzler et al. ............. 330/149 |
| 6,211,737 B1 | * | 4/2001 | Fong ........................... 330/282 |
| 6,212,369 B1 | | 4/2001 | Avasarala .................... 455/333 |
| 6,259,321 B1 | * | 7/2001 | Song et al. .................. 330/254 |
| 6,271,726 B1 | | 8/2001 | Fransis et al. .............. 330/254 |
| 6,510,314 B1 | * | 1/2003 | Kuo ............................ 455/326 |
| 6,525,601 B2 | * | 2/2003 | Gilbert ........................ 327/560 |
| 6,563,374 B1 | * | 5/2003 | Jaussi et al. ................ 327/562 |
| 6,564,043 B2 | * | 5/2003 | Rauhala ..................... 455/251.1 |
| 6,590,438 B1 | * | 7/2003 | Manku et al. .............. 327/359 |
| 6,591,091 B1 | * | 7/2003 | Vorenkamp et al. ...... 455/179.1 |
| 6,591,093 B1 | * | 7/2003 | Coffing et al. ............. 455/319 |
| 6,657,494 B2 | * | 12/2003 | Twomey ..................... 330/254 |
| 6,690,236 B2 | * | 2/2004 | Saito .......................... 330/254 |
| 6,696,888 B2 | * | 2/2004 | Gilbert ........................ 327/560 |
| 6,711,395 B1 | * | 3/2004 | Tonegawa et al. ......... 455/313 |

* cited by examiner

*Primary Examiner*—Timothy P. Callahan
*Assistant Examiner*—Hai L. Nguyen
(74) *Attorney, Agent, or Firm*—Koppel, Jacobs, Patrick & Heybl (57) ABSTRACT

Digitally-controlled, variable-gain mixers and amplifiers are provided which couple transconductance cells to receive respective tap signals from a fixed attenuator that receives a first input signal. A gain interpolator provides first and second control currents with amplitudes that correspond to a segment of a control word and a multiplexer responds to another control-word segment by routing the control currents to a selected pair of adjacent transconductance cells. In response, the transconductance cells provide amplifier current signals which can also be routed to a transistor switch that mixes them with a second input signal to generate a mixer output signal whose amplitude corresponds to the control word.

31 Claims, 4 Drawing Sheets

DIGITALLY-CONTROLLED, VARIABLE-GAIN MIXER AND AMPLIFIER STRUCTURES

BACKGROUND OF THE INVENTION

1. Field of the Invention

The present invention relates generally to variable-gain mixers and amplifiers.

2. Description of the Related Art

Signal mixers are widely used for realizing frequency translation of an input signal by time domain multiplication with a second input signal. For example, mixers in wireless receivers and transmitters generally multiply an input signal with a local-oscillator (LO) signal tol thereby translate (i.e., convert) the input signal to a different mixer output signal. In particular, the time domain multiplication generates mixer output signals with frequencies that are the sum and difference of, the frequencies of the input and LO signals. A desired mixer output signal is typically selected with filters.

In many receivers and transmitters, a mixer is preceded by an amplifier whose gain is adjusted with an automatic gain control (AGC) feedback loop. These structures require substantial circuit space which is, severely limited in modern integrated-circuit wireless systems. In addition, integrated-circuit supply voltages have been constantly reduced (e.g., to 3.3 volts) because this permits finer interconnect structure which facilitates size reduction. The lowered supply voltage, however, limits the available headroom for circuit components which significantly complicates circuit design. These limitations have created a demand for simpler frequency-translation elements that can effectively operate with reduced supply voltages and provide greater accuracy.

BRIEF SUMMARY OF THE INVENTION

The present invention is directed to digitally-controlled, variable-gain mixers that can be operated with reduced supply voltages and less current, that enhance accuracy and reduce spurious signals and that are less expensive in frequency translation applications because they eliminate components. The invention is also directed to digitally-controlled, variable-gain amplifiers and frequency converters.

The novel features of the invention are set forth with particularity in the appended claims. The invention will be best understood from the following description when read in conjunction with the accompanying drawings.

DETAILED DESCRIPTION OF THE INVENTION

Figure 1:
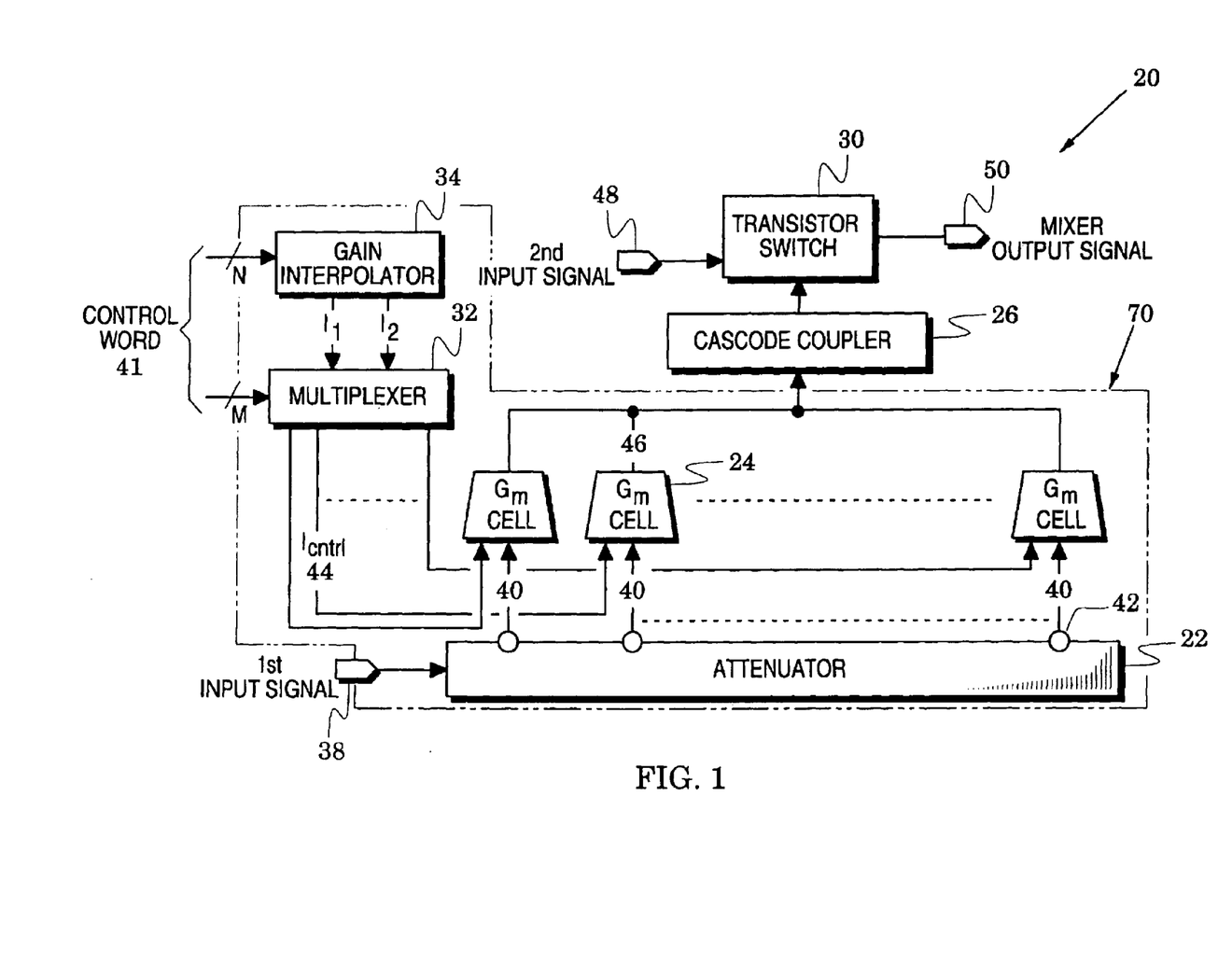
FIG. 1 is a block diagram of digitally-controlled, variable-gain mixer embodiment of the present invention that is formed with a digitally-controlled, variable-gain amplifier embodiment.
Figures 2, 7:
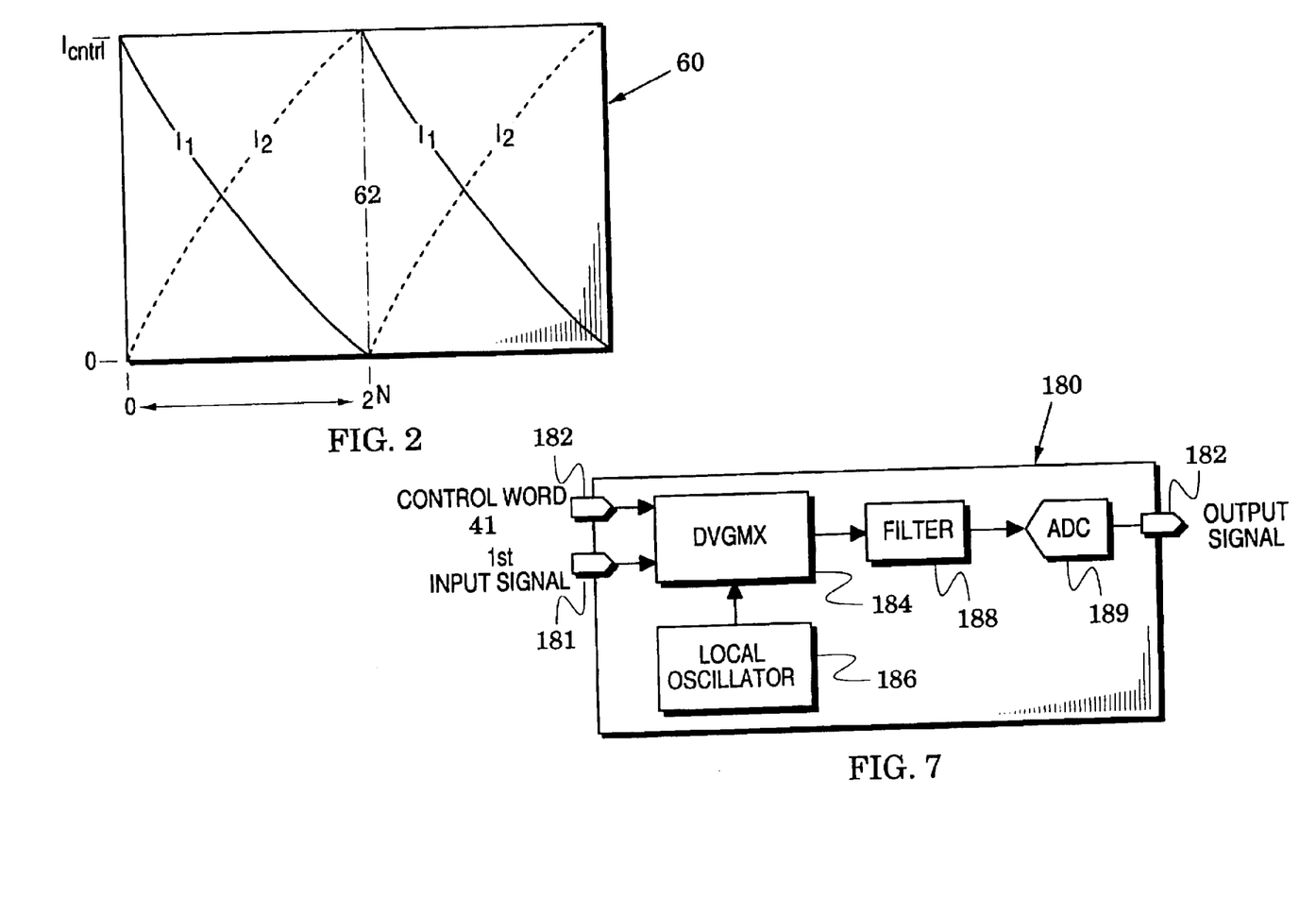
FIG. 2 is a graph that illustrates control currents in a gain interpolator of the mixer of FIG. 1.
FIG. 7 is a block diagram of a frequency converter embodiment of the present invention.
Figure 3:
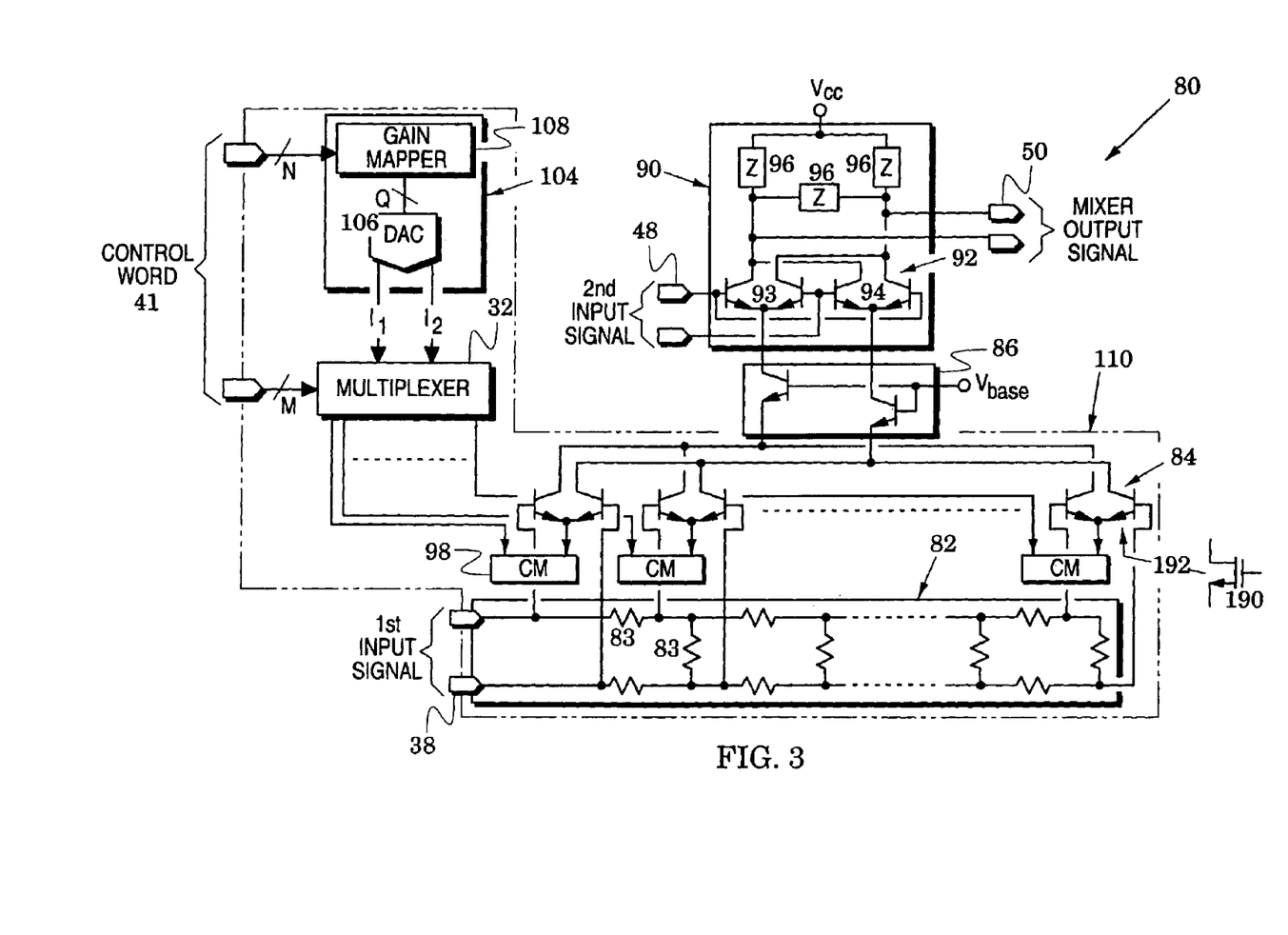
FIG. 3 is a schematic diagram of another digitally-controlled, variable-gain mixer embodiment that is formed with another digitally-controlled, variable-gain amplifier embodiment.
Figure 4:
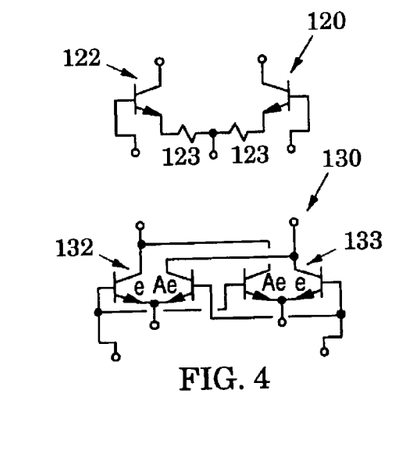
FIG. 4 is a schematic diagram that illustrates transconductance cell embodiments in the mixer of FIG. 3.
Figure 5:
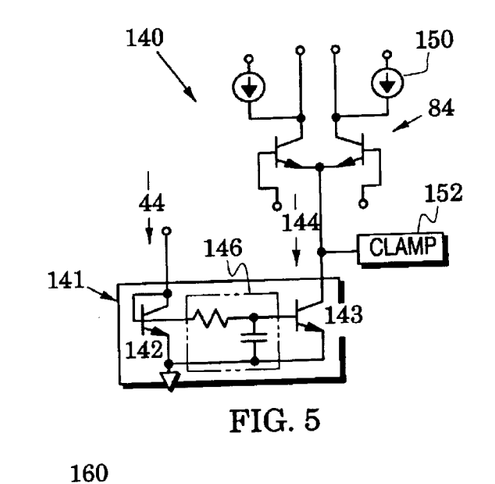
FIG. 5 is a schematic diagram that illustrates current mirror and transconductance cell embodiments in the mixer of FIG. 3.
Figure 6:
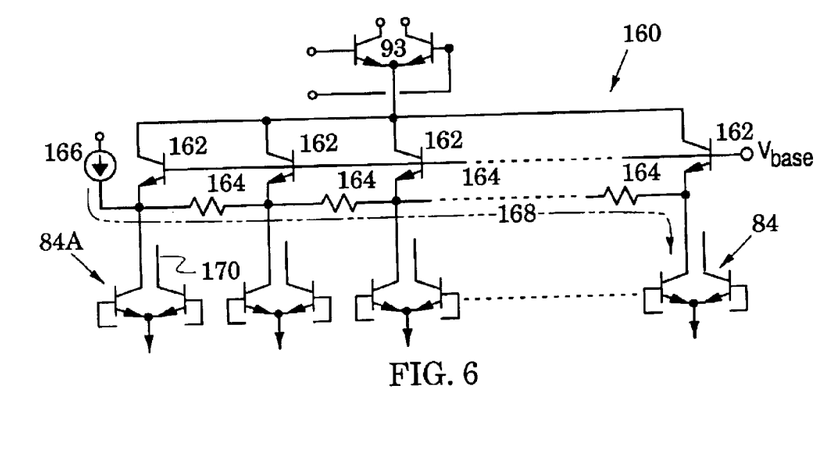
FIG. 6 is a schematic diagram that illustrates a cascode coupler embodiment in the mixer of FIG. 3.

FIGS. 1 and 3 illustrate digitally-controlled, variable-gain mixer embodiments of the present invention, FIG. 2 illustrates control currents in a gain interpolator of these mixers, FIGS. 4, 5 and 6 illustrate transconductance cell, current mirror and cascode coupler embodiments in these mixers, and FIG. 7 illustrates a frequency converter embodiment of the invention. Digitally-controlled, variable-gain amplifier embodiments are also shown in FIGS. 1 and 3.

In particular, the variable-gain mixer 20 of FIG. 1 includes an input attenuator 22, a plurality of transconductance ($G_m$) cells 24, a cascode coupler 26, a transistor switch 30, a multiplexer 32 and a gain interpolator 34. The $G_m$ cells 24 are coupled between the attenuator 22 and the cascode coupler 26 which, in turn, is coupled to the transistor switch 30. The multiplexer 32 receives control currents $I_1$ and $I_2$ from the gain interpolator 34 and routes them to selected ones of the $G_m$ cells.

In operation of the variable-gain mixer 20, a first input signal is received at an input port 38 of the attenuator 22 which provides successively-attenuated tap signals 40 at a plurality of attenuator taps 42. In response to at least M bits of a control word 41, the multiplexer 32 routes a control current ($I_{cntrl}$) 44 to at least a selected one of the $G_m$ cells. The control current 44 enables the selected $G_m$ cell so that it provides a current signal 46 in response to its respective tap signal 40. The amplitude of the current signal 46 is set by the transconductance of the selected $G_m$ cell and linearly corresponds to the amplitude of its respective tap signal 40.

The cascode coupler 26 enhances signal isolation between the first input signal and the mixer output signal. The current signal 46 is routed through the cascode coupler to the transistor switch 30 which also receives a second input signal at an input port 48. In response to the second input signal, the transistor switch 30 essentially "chops" the current signal 46 to thereby generate a mixer output signal at an output, port 50. The mixer output signal is thus the time-domain multiplication of the second input signal and the current signal 46 that was provided by the selected $G_m$ cell 24. Because of this chopping process, the amplitude of the mixer output signal is linearly related to the amplitude of the current signal 46 and substantially independent of the amplitude of the second input signal.

The input attenuator 22 can have various configurations in which the attenuator taps 42 provide precisely-controlled successive attenuations of the first input signal. For example, the input attenuator can be configured so that each successive tap inserts 6 dB of attenuation. The taps 42 would thus provide a first tap signal equal to the first input signal, a second tap signal that is reduced 6 dB below the first tap signal, a third tap signal reduced 12 dB below the first tap signal and so on.

With a constant first input signal, the M bits of the control word 41 can thereby command a mixer output signal that successively decreases in 6 dB steps by digitally instructing the multiplexer 32 to route the control current 44 to each of the $G_m$ cells 24 in succession—beginning at the input end of the attenuator 22 and stopping at the far end of the attenuator. The control current 44 can then be successively routed to downstream $G_m$ cells 24 so that the current signal 46

(provided by successive cells) successively declines by 6 dB and, accordingly, the mixer output signal also declines in 6 dB steps. In a feature of the invention, the multiplexer, in response to the M bits of the control word 41, commands only one of the $G_m$ cells to be active at any time so that the gain of the mixer 20 is essentially set by the tap signals at the taps 42 so that its accuracy is substantially that of the attenuator 22 (in embodiments in which the $G_m$ cells have been structured with equal transconductances).

In another feature of the invention, the gain interpolator 34 is provided to interpolate gain between the currently enabled $G_m$ cell and an adjacent cell. In particular, the gain interpolator responds to the remaining N bits of the control word 41 by partitioning the control current 44 into first and second control currents $I_1$ and $I_2$ which the multiplexer routes to an adjacent pair of $G_m$ cells.

As long as the commanded second control current $I_2$ is zero, however, the multiplexer 32 continues to only route the first control current to the selected $G_m$ cell. When the second control current $I_2$ differs from zero the multiplexer 32 routes this current to the adjacent $G_m$ cell. The N bits thus define $2^N$ different partitions of the control current 44 that vary from a first extreme in which the first control current $I_1$ equals the control current 44 and the second control current $I_2$ is zero to a second extreme in which the first control current $I_1$ is zero and the second control current $I_2$ equals the control current 44.

Because the transconductance gains of the selected pair of $G_m$ cells are a function of their received control currents, their gains vary from a first extreme in which the gains of the first and second $G_m$ cells are respectively a maximum gain and a zero gain to a second extreme in which they are respectively a zero gain and a maximum gain. In between, the composite gain of the selected pair of $G_m$ cells defines $2^N$ interpolation steps from the point where all of the control current is routed to the M-bit selected $G_m$ cell and the point where it is all routed to the adjacent $G_m$ cell. If the M bits then change to select the adjacent $G_m$ cell (i.e., it becomes the selected $G_m$ cell) and the N bits of the control word 41 change to zero, all of the control current continues to be routed through the multiplexer to the newly-selected $G_m$ cell.

In another feature of the invention, therefore, its digital control word 41 commands interpolation via current signals 46 from only an adjacent pair of $G_m$ cells 24 that respond to tap signals 40 from only a respective adjacent pair of taps 42. Interpolation is thus always based on an adjacent pair of tap signals. It has been found that interpolation which is derived from a larger population of taps and cells generally requires additional power dissipation and additional contribution of spurious signals (e.g., noise and distortion). Accordingly, these penalties are substantially reduced by the mixer structures of the invention.

As stated above, the composite gain of the selected pair of $G_m$ cells defines $2^N$ interpolation steps from the point where all of the control current is routed to the M-bit selected $G_m$ cell and the point where it is all routed to the adjacent $G_m$ cell. The gain interpolator 34 can be configured to shape various desired current patterns with these $2^N$ interpolation steps.

An exemplary pattern is illustrated in the graph 60 of FIG. 2 which shows that the first control current $I_1$ is at the level of the control current 44 ($I_{cntrl}$ in FIG. 2) and the second control current $I_2$ is initially zero when the N bits of the control word are set to define zero. As the N bits increase to define the number $2^N$ at the partition line 62, the first control current $I_1$ declines to zero and the second control current $I_2$ increases to the level of the control current. At the beginning of this process, the mixer gain is set by the attenuator tap of the M-bit selected $G_m$ cell. At the end of this process, the mixer gain is set by the attenuator tap of the adjacent $G_m$ cell.

If the M bits of the control word now change to correspond to the tap 42 that is adjacent to the originally selected tap (i.e., the next successive tap) and the N bits change to zero, the first control current $I_1$ jumps back to equal the control current (44 in FIG. 1) as shown at the partition line 6 in FIG. 2. Simultaneously, the multiplexer 32 responds to the M bits and now routes the first control current $I_1$ to the newly-selected $G_m$ cell 24. As the N bits now begin to increase, the multiplexer will begin to divert an increasing portion to the $G_m$ cell that is next in line down the attenuator 22. Thus, the gain interpolator 34 repeats its processes in response to the less-significant N bits of the control word and the multiplexer 32 responds to the more-significant M bits by defining the taps 42 and $G_m$ cells 24 that bound this interpolation.

Various other mixer embodiments can be formed by structuring the multiplexer and gain interpolator to have different responses to the control word 41. In one embodiment, for example, when the M bits of the control word change to correspond to the tap 42 that is adjacent to the originally selected tap (i.e., the next successive tap) and the N bits change to zero, the first control current $I_1$ remains constant (and the second control current $I_2$ remains at zero) but the multiplexer 32 simply interchanges the routing of these control currents.

In particular, the second control current $I_2$ is routed to the tap 42 that is adjacent to the originally selected tap and the first control current $I_1$ is routed to the $G_m$ cell that is next in line down the attenuator 22. This response can be thought of as a change in nomenclature. What was previously the second control current $I_2$ is now the first control current $I_1$ (whose current now equals the control current 44) and what was previously the first control current $I_1$ is now the second control current $I_2$ (whose current is now zero). It has been found that this embodiment is especially effective at reducing spurious signals that result from large instantaneous changes in the first and second control currents $I_1$ and $I_2$. In this embodiment, these spurious signals are reduced because the large instantaneous changes are eliminated.

As mentioned above, the shape of the first and second control currents $I_1$ and $I_2$ can be adjusted to obtain any desired interpolation response with a resolution of $2^N$. In an exemplary adjustable-gain mixer in which the taps 42 of FIG. 1 define 6 dB tap attenuations and in which N is 6, the first and second control currents of FIG. 2 are shaped to command $2^N$ gain reductions of 0.0938 dB. In this example, the variable-gain mixer 20 of FIG. 1 responds to the control word 41 with a linear-in-dB response that is bounded by the first and last taps 42 of the fixed attenuator 22.

As described above, the amplitude of the current signal 46 that is routed to the cascode coupler 26 is a function of the control word 41 and the amplitude of the mixer output signal is linearly related to the amplitude of the current signal 46. Accordingly, the invention also provides a digitally-controlled, adjustable-gain transconductance amplifier that is defined within the broken-lines 70 of FIG. 1. An output buffer such as the cascode coupler can, of course, be added to form a different amplifier embodiment.

FIG. 3 illustrates another adjustable-gain mixer embodiment 80 that includes elements of the adjustable-gain mixer 20 of FIG. 1 with like elements indicated by like reference numbers. In the embodiment 80, the fixed attenuator 22 of FIG. 1 is realized with a ladder 82 of impedance elements 83 and the $G_m$ cells 24 are realized with differential pairs 84 of transistors. First current terminals (i.e., emitters) of the differential pairs 84 are coupled to receive an enabling tail current, control terminals (i.e., bases) are coupled to respective taps of the ladder 82 and second current terminals (i.e., collectors) are available to deliver the current signals 46 of FIG. 1.

The transistor switch 30 of FIG. 1 is realized with a balanced switch structure 90 formed with a pair 92 of cross-coupled differential pairs 93 and 94 of transistors that have impedance loads 96 arranged in series and in parallel in their collectors (in different embodiments, the loads can include resistors, inductors and capacitors). First current terminals (if the differential pairs 93 and 94 are available to receive current signals, cross-coupled control terminals are coupled to receive the second input signal from the port 48 and second current terminals are coupled to the loads 96 to thereby deliver the mixer output signal at the port 50. Although the impedance elements of the ladder 82 and the loads 96 are shown a resistors, other impedance elements (e.g., inductors) can be used in other, mixer embodiments.

The cascode coupler 26 of FIG. 1 is realized with a pair 86 of cascode, transistors that each couple a respective transistor in each differential pair 84 to a respective one of the cross-coupled differential pairs 93 and 94 and each receive a common base bias $V_{base}$. Each of the cascode transistors thus forms a cascode amplifier stage with a respective, transistor of the differential pairs. Finally, the control current 44 of the multiplexer 32 is coupled to enable each differential pair 90 via a respective current mirror (CM) 98 that provides an enabling tail current for the coupled emitters of its respective differential pair 84.

The gain interpolator 34 of FIG. 1 is realized with a gain interpolator 104 that includes a differential-output digital-to-analog converter (DAC) 106. The DAC 106 can be suitably structured to provide the first and, second control currents $I_1$ and $I_2$ and map their amplitudes to achieve any desired interpolation pattern between attenuator taps (e.g., achieve the map of the currents $I_1$ and $I_2$ in the graph 60 of FIG. 2).

In another interpolator embodiments, however, the DAC 106 is more, conveniently configured to provide the first and second control currents $I_1$ and $I_2$ in a linear response to a Q-bit input signal which is provided by a digital gain mapper 108 which receives the N bits of the control word 41. Q is preferably greater than N so that the DAC 106 has a significantly-enhanced resolution which enables it to accurately define various shapes that may be requested for the first and second control currents $I_1$ and $I_2$ of FIG. 2. Mixer embodiments have provided, for example, gain steps as small as 0.1 dB with an accuracy of 00.025 dB.

Although the mapping can be permanently fixed, other digital mappers can be configured to facilitate programmable mapping. In still other embodiments, the mapping can be intentionally altered to compensate for non-ideal circuit effects that arise in practical, realizations (e.g., due to limited gain or nonlinear components).

As described above, FIG. 1 also illustrates a digitally-controlled, adjustable-gain transconductance amplifier 70. Similarly, FIG. 3 illustrates another digitally-controlled, adjustable-gain transconductance amplifier that is defined within the broken-lines 110. An output buffer such as the cascode coupler 86 can, of course, be added to form a different amplifier embodiment.

In other mixer embodiments, gain linearity can be further enhanced with different $G_m$ cell configurations. For example, the differential pairs 84 of FIG. 3 can be replaced with the $G_m$ cell 120 of FIG. 4 which is formed with a differential pair 122 of transistors in which degeneration resistors 123 are inserted before each emitter to enhance linearity.

In another example, the differential pairs 84 can be replaced with the $G_m$ cell 130 of FIG. 4 which is formed with two differential pairs 132 and 133 that are cross coupled. In a configuration generally known as a multi-tanh doublet, each differential pair is formed with different emitter areas e and Ae wherein A is a number greater than one (e.g., 4) and is arranged so that transistors with areas e and Ae respond to the same side of a differential drive signal. Other multi-tanh arrangements can also be used, e.g., a multi-tanh triplet.

In the diagram 140 of FIG. 5, the current mirror 98 of FIG. 3 is realized as a current mirror 141 which comprises a diode-coupled transistor 142 that is base-coupled to a mirror transistor 143 which is coupled to the emitters of a $G_m$ cell in the form of the differential pair 84 of transistors shown in FIG. 3.

In operation of the current mirror 141, the command current 44 is mirrored via the mirror transistor 143 to become a tail current 144 that enables and sets the transconductance gain of the differential pair 84. A filter 146 (e.g., a low-pass filter formed with a series resistor and a parallel capacitor) may be inserted between the mirror transistors to reduce transient signals (e.g., transients originating in the DAC 106 of FIG. 3 that would otherwise be coupled to the $G_m$ cell current signals (46 in FIG. 1).

Variable-gain mixers of the invention are especially suited for use in integrated circuits in which the available supply voltage ($V_{cc}$ in FIG. 3) is severely limited (e.g., to 3.3 volts). This limitation can be further accommodated by providing offset current sources 150 in FIG. 5. Because they are configured to provide a portion of the direct current (DC) collector currents of the differential pair 84, they permit an equivalent reduction in the DC currents drawn from elements above the differential pair (e.g., the pair 86 of cascode transistors and the balanced transistor switch 90 of FIG. 3). In effect, they thus permit a lowering of the supply voltage $V_{cc}$ in FIG. 3.

When a downstream $G_m$ cell 84 (i.e., one further from the input port 38) is enabled in the mixer of FIG. 3, it is important that upstream $G_m$ cells remain off and, in addition, do not degrade the first input signal as it passes by their respective taps. The possibility of such degradation becomes most likely for the taps closest to the input of the attenuator 82 because there the amplitude of the first input signal is at a maximum. Accordingly, the diagram 140 of FIG. 5 includes a voltage clamp 152 coupled to the emitters of the differential pair 84.

The clamp is configured to be activated when the current mirror 141 is not supplying an enabling tail current 144. At that time it applies a clamp voltage which applies a reverse bias to the base-emitter junctions of the differential pair. This bias insures that the junctions are not forward biased by a large first input signal. Accordingly, the differential pair remains off and does not degrade the first input signal as it passes by.

FIG. 6 illustrates another embodiment 160 of the coupler 26 of FIG. 1. In the cascode coupler 160, each transistor of the differential pairs 84 is provided with a respective cascode transistor 162 that couples it to the differential pair 93 in the balanced transistor switch 90 of FIG. 3. Each cascode transistor thus forms a cascode amplifier stage with a respective transistor of a respective differential pair. The bases of the cascode transistors receive a common bias voltage $V_{base}$.

Impedance elements in the form of resistors 164 are coupled between adjacent emitters of the cascode transistors and a current source 166 drives a bias current 168 downstream through this string of resistors to the differential pair 84 that has been enabled by a control current (44 in, FIG. 1) from the multiplexer 32 of FIG. 1. Another set of cascode transistors 162, resistors 164 and current source 166 is provided for the collectors 170 of the other transistors of the differential pairs 84 but this set is not shown in FIG. 6 to enhance illustrative clarity.

A reference voltage is established at a collector of the enabled differential pair by the bias voltage $V_{base}$ and the voltage drop through a base-emitter junction of a corresponding cascode transistor. Relative to this reference voltage, the bias current 168 "lifts" the collector voltages of the differential pairs 84 that are upstream from the enabled differential pair. Accordingly, an increasing reverse bias is established across the base-collector junctions of these upstream differential pairs, i.e., it is greatest for the differential pair 84A at the input port 38.

It is noted that the first input signal of FIG. 3 has a greater amplitude as it passes these upstream differential pairs and this amplitude may be large enough to forward bias the base-collector junctions in the upstream differential pairs 84 (particularly in the initial differential pair 84A) which would significantly degrade the fidelity of the first input signal. The structure of the cascode coupler 160 prevents this degradation by increasing the reverse bias of the base-collector junctions of the upstream differential pairs. In addition, the increased reverse bias reduces the parasitic base-collector capacitance so that it presents a greater impedance that also reduces degradation of the first input signal.

Digitally-controlled, variable-gain mixers of the invention are especially suited for use in frequency converters such as the converter 180 of FIG. 7 which can translate a first input signal at an input port 181 to a mixer output signal at an output port 182. The mixer output signal has a different frequency and is realized with a signal gain that varies in response to a control word 41 at a digital port 183.

In the converter 180, a digitally-controlled, variable-gain mixer (DVGMX) 184 is configured in accordance with the present invention (e.g., as shown in FIGS. 1 and 3) and receives the first input signal and also a local oscillator signal from a local oscillator 186. The local oscillator signal is thus the second input signal that is shown at the input port 48 in FIGS. 2 and 3.

A filter 188 is inserted to pass (and thereby select) desired components of the mixer output signal (i.e., desired mixer products). For example, the filter can be configured to pass signals which are the sum of, the first input signal and the local oscillator signal and, alternatively, can, be configured to pass signals which are the difference of the first input signal and the local oscillator signal. In other converter embodiments, an analog-to-digital converter (ADC) 189 can be inserted to convert the mixer output signal to a digital format.

Because it has no need of a separate variable-gain amplifier, the frequency converter 180 of FIG. 7 reduces the space and current demand that are typically required by conventional converters so that it reduces power dissipation and production costs.

The structure of mixers and amplifiers of the invention enhance headroom so that they can be operated with reduced supply voltages. In addition, their digital control is structured to enhance the repeatability and resolution of mixer and amplifier output signals. Spurious components (e.g., noise and distortion) are reduced in these signals because current signals are processed from only one or both of adjacent pairs of transconductance cells.

Although variable-gain mixer and amplifier embodiments of the invention have been described with reference to bipolar junction transistors, other mixer embodiments are formed by substituting various other transistor structures, e.g., complementary metal-oxide-semiconductor (MOS) transistors. This substitution is exemplified in FIG. 3 where an MOS transistor 190 is substituted for a bipolar junction transistor of the differential pair 84 as indicated by substitution arrow 192.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A variable-gain mixer that provides a mixer output signal in response to first and second input signals, comprising:

an attenuator configured to receive said first input signal and have a plurality of taps that provide successively-attenuated tap signals;

a plurality of transconductance cells that are each coupled to receive a respective one of said tap signals;

a multiplexer that, in response to at least a first segment of a control word, routes a control current to enable at least a selected one of said transconductance cells and provide therefrom a current signal that corresponds to a respective one of said tap signals; and a transistor switch arranged to multiply said current signal and said second input signal to thereby provide a mixer output signal whose amplitude corresponds to the amplitude of the selected cell's tap signal;

and further including:

a plurality of cascode transistors that are inserted to each couple a respective one of said transconductance cells to said transistor switch;

a plurality of resistors each coupled between a respective adjacent pair of said cascode transistors; and a current source coupled to drive a bias current through said resistors to thereby vary a bias signal of said transconductance cells.

2. A variable-gain amplifier, comprising:

an attenuator configured to receive an input signal and have a plurality of taps that provide successively-attenuated tap signals;

a plurality of transconductance cells that are each coupled to receive a respective one of said tap signals;

a multiplexer that, in response to at least a first segment of a control word, routes a control current to enable at least a selected one said transconductance cells and provide therefrom a current signal whose amplitude corresponds to the tap signal of said selected transconductance cell; and a gain interpolator that, in response to a second segment of said control word, provides said control current to said multiplexer.

3. The amplifier of claim 2, wherein said gain interpolator comprises a digital-to-analog converter.

4. The amplifier of claim 2, wherein said gain interpolator comprises:
   a digital gain mapper that maps said second control word segment to a shaped control word that corresponds to a predetermined gain interpolation; and
   a digital-to-analog converter that provides said first and second divided control currents in response to said shaped control word.

5. A variable-gain amplifier, comprising:
   an attenuator configured to receive an input signal and have a plurality of taps that provide successively-attenuated tap signals;
   a plurality of transconductance cells that are each coupled to receive a respective one of said tap signals;
   a multiplexer that, in response to at least a first segment of a control word, routes a control current to enable at least a selected one of said transconductance cells and provide therefrom a current signal whose amplitude corresponds to the tap signal of said selected transconductance cell; and
   a gain interpolator that, in response to a second segment of said control word, divides said control current into first and second divided control currents;
   and wherein said multiplexer, in response to said first control word segment, routes said first and second divided control currents to enable and adjust the gain of a selected pair of said transconductance cells and provide from said selected pair, first and second portions of said current signal.

6. The amplifier of claim 5, wherein said gain interpolator comprises a digital-to-analog converter.

7. The amplifier of claim 5, wherein said gain interpolator comprises:
   a digital gain mapper that maps said second control word segment to a shaped control word that corresponds to a predetermined gain interpolation; and
   a digital-to-analog converter that provides said first and second divided control currents in response to said shaped control word.

8. The amplifier of claim 5, wherein said attenuator is a plurality of impedance elements arranged to form a ladder which defines said taps.

9. The amplifier of claim 5, wherein each of said transconductance cells includes a differential pair of transistors.

10. The amplifier of claim 9, further including at least one current source is coupled to said differential pair to enhance head room.

11. The amplifier of claim 5, wherein each of said transconductance cells comprise a multi-tanh arrangement of a plurality of differential pairs of transistors.

12. The amplifier of claim 5, further including a current mirror that routes said control current to said selected transconductance cell.

13. The amplifier of claim 5, further including:
   a plurality of cascode transistors that are inserted to each couple a respective one of said transconductance cells to said transistor switch;
   a plurality of resistors each coupled between a respective adjacent pair of said cascode transistors; and
   a current source coupled to drive a bias current through said resistors to thereby vary a bias signal of said transconductance cells.

14. A variable-gain mixer that provides a mixer output signal in response to first and second input signals, comprising:
   an attenuator configured to receive said first input signal and have a plurality of taps that provide successively-attenuated tap signals;
   a plurality of transconductance cells that are each coupled to receive a respective one of said tap signals;
   a multiplexer that, in response to at least a first segment of a control word, routes a control current to enable at least a selected one of said transconductance cells and provide therefrom a current signal that corresponds to a respective one of said tap signals; and
   a transistor switch arranged to multiply said current signal and said second input signal to thereby provide a mixer output signal whose amplitude corresponds to the amplitude of the selected cell's tap signal;
   and further including a gain interpolator that, in response to a second segment of said control word, provides said control current to said multiplexer.

15. The mixer of claim 14, wherein said gain interpolator comprises a digital-to-analog converter.

16. The mixer of claim 14, wherein said gain interpolator comprises:
   a digital gain mapper that maps said second control word segment to a shaped control word that corresponds to a predetermined gain interpolation; and
   a digital-to-analog converter that provides said first and second divided control currents in response to said shaped control word.

17. The mixer of claim 14, wherein each of said transconductance cells comprise a multi-tanh arrangement of a plurality of differential pairs of transistors.

18. A variable-gain mixer that provides a mixer output signal in response to first and second input signals, comprising:
   an attenuator configured to receive said first input signal and have a plurality of taps that provide successively-attenuated tap signals;
   a plurality of transconductance cells that are each coupled to receive a respective one of said tap signals;
   a multiplexer that, in response to at least a first segment of a control word, routes a control current to enable at least a selected one of said transconductance cells and provide therefrom a current signal that corresponds to a respective one of said tap signals; and
   a transistor switch arranged to multiply said current signal and said second input signal to thereby provide a mixer output signal whose amplitude corresponds to the amplitude of the selected cell's tap signal;
   and further including a gain interpolator that, in response to a second segment of said control word, divides said control current into first and second divided control currents and wherein said multiplexer, in response to said first control word segment, routes said first and second divided control currents to enable and adjust the gain of a selected pair of said transconductance cells and provide from said selected pair, first and second portions of said current signal.

19. The mixer of claim 18, wherein said gain interpolator comprises a digital-to-analog converter.

20. The mixer of claim 18, wherein said gain interpolator comprises:
   a digital gain mapper that maps said second control word segment to a shaped control word that corresponds to a predetermined gain interpolation; and
   a digital-to-analog converter that provides said first and second divided control currents in response to said shaped control word.

21. The mixer of claim 18, wherein said attenuator is a plurality of impedance elements arranged to form a ladder which defines said taps.

22. The mixer of claim 18, wherein each of said transconductance cells includes a differential pair of transistors.

23. The mixer of claim 22, further including at least one current source is coupled to said differential pair to enhance head room.

24. The mixer of claim 18, wherein each of said transconductance cells comprise a multi-tanh arrangement of a plurality of differential pairs of transistors.

25. The mixer of claim 18, wherein said transistor switch comprises cross-coupled first and second differential pairs of transistors.

26. The mixer of claim 18, further including a current mirror that routes said control current to said selected transconductance cell.

27. The mixer of claim 18, further including at least one cascode transistor inserted to couple the current signal of said selected transconductance cell to said transistor switch.

28. A frequency converter whose gain corresponds to a control word, comprising:
   an oscillator that provides an oscillator signal;
   a variable-gain mixer that includes:
   a) an attenuator configured to receive an input signal and to have a plurality of taps that provide successively-attenuated tap signals;
   b) a plurality of transconductance cells that are each coupled to receive a respective one of said tap signals;
   c) a multiplexer that receives a first segment of said control word;
   d) a gain interpolator that provides first and second control currents with amplitudes that correspond to a second segment of said control word wherein, in response to said first control word segment, said multiplexer routes said first and second control currents to enable and adjust the gain of a selected adjacent pair of said transconductance cells and provide therefrom first and second current signals in response to the selected pair's respective tap signal; and
   e) a transistor switch arranged to multiply said first and second current signals with said local oscillator signal to thereby provide a mixer output signal with a gain that corresponds to said control word; and
   a filter configured to pass a selected frequency region of said mixer output signal.

29. The converter of claim 28, wherein said gain interpolator comprises:
   a digital gain mapper that maps said second control word segment to a shaped control word that corresponds to a predetermined gain interpolation; and
   a digital-to-analog converter that provides first and second control currents that correspond to said shaped control word.

30. The converter of claim 28, further including:
   a plurality of cascode transistors that are inserted to each couple a respective one of said transconductance cells to said transistor switch;
   a plurality of resistors each coupled between a respective adjacent pair of said cascode transistors; and
   a current source coupled to drive a bias current through said resistors to thereby vary a bias signal of said transconductance cells.

31. The converter of claim 28, further including an analog-to-digital converter that converts the selected frequency region of said mixer output signal to a corresponding digital signal.

* * * * *